US011677419B2

(12) United States Patent
Maunder et al.

(10) Patent No.: US 11,677,419 B2
(45) Date of Patent: *Jun. 13, 2023

(54) CYCLIC REDUNDANCY CHECK, CRC, DECODING USING THE INVERSE CRC GENERATOR POLYNOMIAL

(71) Applicant: Accelercomm Limited, Southampton (GB)

(72) Inventors: Robert Maunder, Southampton (GB); Matthew Brejza, Southampton (GB)

(73) Assignee: Accelercomm Limited, Southampton (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/623,441

(22) PCT Filed: Jun. 30, 2020

(86) PCT No.: PCT/EP2020/068426
§ 371 (c)(1),
(2) Date: Dec. 28, 2021

(87) PCT Pub. No.: WO2021/001382
PCT Pub. Date: Jan. 7, 2021

(65) Prior Publication Data
US 2022/0352901 A1    Nov. 3, 2022

(30) Foreign Application Priority Data

Jul. 1, 2019 (GB) ..................................... 1909489
Apr. 15, 2020 (GB) ..................................... 2005501

(51) Int. Cl.
*H03M 13/09* (2006.01)
*H03M 13/00* (2006.01)
(Continued)

(52) U.S. Cl.
CPC ....... *H03M 13/091* (2013.01); *H03M 13/617* (2013.01); *H03M 13/098* (2013.01); *H03M 13/1168* (2013.01); *H03M 13/1575* (2013.01)

(58) Field of Classification Search
CPC .......................... H03M 13/091; H03M 13/617
See application file for complete search history.

(56) References Cited

U.S. PATENT DOCUMENTS 4,914,660 A    4/1990    Hirose
5,040,179 A *    8/1991    Chen ..................... H03M 13/15
                                                 714/759

(Continued)

FOREIGN PATENT DOCUMENTS

EP            0551646 A2    7/1993
WO       2016050323 A1    4/2016

*Primary Examiner* — Joseph D Torres
(74) *Attorney, Agent, or Firm* — Optimus Patents US, LLC

(57) ABSTRACT

A cyclic redundancy check, CRC, decoder circuit having a K-bit input bit sequence, s, comprising information bits and CRC bits; and at least one processor (P) configured to perform a CRC decode computation and configured to: use an inverse of a predefined CRC generator polynomial that encoded the K-bit input bit sequence, s, to produce a data set; compute a CRC syndrome from the data set; and determine whether the CRC syndrome contains any one-valued bits indicative of a CRC error. An LUT stores one or more rows of a CRC generator matrix (G) generated from the inverse of the predefined CRC generator polynomial. A set of mod(-K,P) zero-valued filler bits are appended to an end of the K-bit input bit sequence, wherein an order of the rows in the CRC generator matrix (G) is reversed and aligned with the input bits of the input stream.

20 Claims, 11 Drawing Sheets

(51) Int. Cl.
*H03M 13/11* (2006.01)
*H03M 13/15* (2006.01)

(56) References Cited

U.S. PATENT DOCUMENTS

| | | | | |
|---|---|---|---|---|
| 5,596,589 | A | * | 1/1997 | Thomsen ............ H03M 13/152 |
| | | | | 714/759 |
| 5,878,057 | A | | 3/1999 | Maa |
| 6,029,186 | A | | 2/2000 | Desjardins |
| 2013/0061115 | A1 | * | 3/2013 | Imai ...................... H03M 13/09 |
| | | | | 714/763 |
| 2014/0026022 | A1 | | 1/2014 | Hill |
| 2015/0207507 | A1 | | 7/2015 | Kuang |
| 2022/0350697 | A1 | * | 11/2022 | Maunder ............. H03M 13/091 |

\* cited by examiner

CYCLIC REDUNDANCY CHECK, CRC, DECODING USING THE INVERSE CRC GENERATOR POLYNOMIAL

FIELD OF THE INVENTION

The field of the invention relates to a Cyclic Redundancy Check (CRC) circuit, a communication unit, and a method for computation of a CRC. The field of the invention is applicable to, but not limited to, channel coding for current and future generations of communication standards.

BACKGROUND OF THE INVENTION

It is known that a Cyclic Redundancy Check (CRC) may be used to detect whether any errors have been introduced into a sequence of information bits, when it is transferred from a source to a sink.

CRC Computation at the Source

At the source, a CRC computation is performed upon a sequence of A information bits:

$a = [a_0, a_1, a_2, \ldots, a_{A-1}]$, in order to generate a sequence of L parity bits:

$p = [p_0, p_1, p_2, \ldots, p_{L-1}]$

The sequence of parity bits p is generated as a function of the of A information bits of a, according to a CRC generator polynomial. The CRC generation polynomial is typically specified in a communication standard being implemented, such as the L=6-bit CRC generator polynomial:

$g_{CRC6}(D) = [D^6 + D^5 + 1]$ of 3GPP New Radio [1]. It is noteworthy that the communication standard typically specifies constraints that dictate the generation of the CRC, without specifying how it can be implemented. More specifically, the communication standards often only specify that the computation is performed in a systematic form, such that the polynomial:

$$a_0 D^{A+L-1} + a_1 D^{A+L-2} + \ldots + a_{A-1} D^L + p_0 D^{L-1} + p_1 D^{L-2} + \ldots + p_{L-2} D^1 + p_{L-1}$$

yields a remainder equal to '0' in GF(2) when divided by the CRC generator polynomial.

The sequence of L parity bits p is typically attached to the end of the sequence of A information bits a, in order to produce the CRC-encoded sequence of B=A+L bits $b = [b_0, b_1, b_2, \ldots, b_{B-1}]$, where $b_k = a_k$ for $k = 0, 1, 2, \ldots, A-1$ and
$b_k = p_{k-A}$ for $k = A, A+1, A+2, \ldots, A+L-1$.

Some communication standards dictate that before CRC computation, the sequence of A information bits a may be attached to the end of a sequence of L1-valued bits, in order to generate an extended information bit sequence, comprising L+A bits:

$a' = [a'_0, a'_1, a'_2, \ldots, a'_{L+A-1}]$, where:

$a'_k = 1$ for $k = 0, 1, 2, \ldots, L-1$ and
$a'_k = a_{k-L}$ for $k = L, L+1, L+2, \ldots, L+A-1$.

In these cases, the sequence of L parity bits p may be computed as a function of all L+A bits of the extended information bit sequence a', rather than as a function of the A bits of the information bit sequence a. The sequence of L parity bits may be attached to the end of the sequence of A information bits a, in order to produce the CRC-encoded sequence of:

$B = A+L$ bits $b = [b_0, b_1, b_{B-1}]$, as above.

In some cases, the bits of the CRC-encoded sequence b may be scrambled, interleaved and/or channel encoded at the source.

CRC Computation at the Sink

At the sink, a CRC computation may be performed to detect errors within a sequence of B=A+L recovered CRC-encoded bits:

$\hat{b} = [\hat{b}_0, \hat{b}_1, \hat{b}, \ldots, \hat{b}_{B-1}]$, which will differ to the CRC-encoded bit sequence b obtained in the source if errors are present. Here, the recovered CRC-encoded bit sequence $\hat{b}$ may represent the attachment of a sequence of L recovered parity bits:
$\hat{p} = [\hat{p}_0, \hat{p}_1, \hat{p}_2, \ldots, \hat{p}_{L-1}]$ on to the end of a sequence of A recovered information bits:
$\hat{a} = [\hat{a}_0, \hat{a}_1, \hat{a}_2, \ldots, \hat{a}_{A-1}]$, which will differ to parity bits sequence p and information bit sequence a obtained in the source if errors are present.

Errors may be detected by performing a CRC computation to obtain a sequence of L computed parity bits:

$\tilde{p} = [\tilde{p}_0, \tilde{p}_1, \tilde{p}_2, \ldots, \tilde{p}_{L-1}]$ as a function of the A recovered information bits of $\hat{a}$. If the computed parity bit sequence $\tilde{p}$ differs to the recovered parity bit sequence $\hat{p}$, then errors have been detected. Alternatively, errors may be detected by performing a CRC computation to obtain a sequence of L computed parity bits:

$\tilde{p} = [\tilde{p}_0, \tilde{p}_1, \tilde{p}_2, \ldots, \tilde{p}_{L-1}]$ as a function of all B=A+L recovered CRC-encoded bits of $\hat{b}$. In this case, the computed parity bit sequence $\tilde{p}$ becomes a syndrome (as understood) for the CRC. If this syndrome $\tilde{p}$ does not equal a sequence of L 0-valued bits, then errors have been detected. Note that standards typically do not specify how to use the CRC to detect errors, allowing the implementer to select either of the methods described here, or another method.

In cases where the source obtains an extended information bit sequence a' by attaching the sequence of A information bits a to the end of a sequence of L 1-valued bits, the same extension operation is performed in the sink. More specifically, the sequence of A recovered information bits a is attached to the end of a sequence of L 1-valued bits, in order to generate an extended recovered information bit sequence, comprising L+A bits:

$\hat{a}' = [\hat{a}'_0, \hat{a}'_1, \hat{a}'_2, \ldots, \hat{a}'_{L+A-1}]$, where:

$\hat{a}'_k = 1$ for $k = 0, 1, 2, \ldots, L-1$ and
$\hat{a}'_k = \hat{a}_{k-L}$ for $k = L, L+1, L+2, \ldots, L+A-1$.

In these cases, the sequence of L computed parity bits $\tilde{p}$ may be computed as a function of all L+A bits of the extended recovered information bit sequence $\hat{a}'$, rather than as a function of the A bits of the recovered information bit sequence $\hat{a}$. Alternatively, the sequence of B recovered CRC-encoded bits $\hat{b}$ may be attached to the end of a sequence of L 1-valued bits, in order to generate an extended recovered CRC-encoded bit sequence, comprising L+B bits:

$\hat{b}' = [\hat{b}'_0, \hat{b}'_1, \hat{b}'_2, \ldots, \hat{b}'_{L+B-1}]$, where:

$\hat{b}'_k = 1$ for $k = 0, 1, 2, \ldots, L-1$ and
$\hat{b}'_k = \hat{b}_{k-L}$ for $k = L, L+1, L+2, \ldots, L+B-1$.

In these cases, the sequence of L computed syndrome bits $\tilde{p}$ may be computed as a function of all L+B bits of the extended recovered CRC-encoded bit sequence $\hat{b}'$, rather than as a function of the B bits of the recovered CRC-encoded bit sequence $\hat{b}$.

In cases where the source performs scrambling, interleaving and/or channel encoding upon the bits of the CRC-encoded sequence b, the inverse descrambling, deinterleaving and/or channel decoding operations may be performed in the sink, in order to obtain the recovered CRC-encoded bit sequence $\hat{b}$. In cases where the scrambling of the CRC-encoded sequence b in the source affects only its bits that were provided by the parity bit sequence p, the sink may apply the inverse scrambling operation to the computed parity bit sequence $\tilde{p}$ after CRC computation, rather than applying it to the recovered CRC-encoded bit sequence $\hat{b}$ before CRC computation.

CRC Computation Using a Shift Register

Referring now to FIG. 1, a known shift register implementation 100 of a L=6-bit CRC generator polynomial $g_{CRC6}(D)=[D^6+D^5+1]$ of a source circuit is illustrated. The CRC generator polynomial may be interpreted as a linear feedback shift register 101, as exemplified in FIG. 1 for the L=6-bit CRC generator polynomial:

$$g_{CRC6}(D)=[D^6+D^5+1] \text{ of [1]}.$$

This shift register may be used to compute a sequence of L parity bits:

p=[$p_0, p_1, p_2, \ldots, p_{L-1}$] 102, corresponding to a sequence of K input bits:

s=[$s_0, s_1, s_2, \ldots, s_{K-1}$] 103, which may be provided by the information bit sequence a, the extended information bit sequence a', the recovered information bit sequence $\hat{a}$, the recovered CRC-encoded bit sequence $\hat{b}$, the recovered extended information bit sequence $\hat{a}'$ or the recovered extended CRC-encoded bit sequence $\hat{b}'$. FIG. 1 illustrates at 104 how the sequence of A=12 information bits:

a=[0 1 1 0 0 1 1 1 0 1 1 0] may be converted into the sequence of L=6 parity bits:

p=[1 0 0 1 0 1], where K=A and s=a. These parity bits may be attached to the end of the information bit sequence a in order to obtain the sequence of B=18 CRC-encoded bits:

b=[0 1 1 0 0 1 1 1 0 1 1 0 1 0 0 1 0 1].

Note that some applications may employ the inverse of a CRC generator polynomial, which may be obtained by subtracting each of its exponents from L. For example, the inverse of the L=6-bit CRC generator polynomial:

$$g_{CRC6}(D)=[D^6+D^5+1]=[D^6+D^5+D^0] \text{ is given by:}$$

$$g_{invCRC6}(D)=[D^{L-6}+D^{L-5}+D^{L-0}]=[D^6+D+1].$$

An inverse generator polynomial may be represented by an inverse linear feedback shift register 201, as exemplified in FIG. 2 for the L=6-bit inverse CRC generator polynomial:

$$g_{invCRC6}(D)=[D^6+D+1].$$

Referring now to FIG. 2, a known shift register implementation 200 of a L=6-bit inverse CRC generator polynomial:

$$g_{invCRC6}(D)=[D^6+D+1] \text{ of a source circuit is illustrated.}$$

FIG. 2 illustrates at 204 how the same sequence of A=12 information bits:

a=[0 1 1 0 0 1 1 1 0 1 1 0] from FIG. 1 may be converted into the sequence of L=6 parity bits:

p=[1 0 0 1 1 1], where K=A and s=a.

Note that these parity bits differ to those of FIG. 1, since the inverse generator polynomial:

$$g_{invCRC6}(D)=[D^6+D+1] \text{ differs to the generator polynomial:}$$

$$g_{CRC6}(D)=[D^6+D^5+1].$$

CRC Computation Using a Generator Matrix

A generator matrix may be used to perform CRC computation for a sequence of K input bits:

s=[$s_0, s_1, s_2, \ldots, s_{K-1}$], which may be provided by the information bit sequence a, the extended information bit sequence a', the recovered information bit sequence $\hat{a}$, the recovered CRC-encoded bit sequence $\hat{b}$, the recovered extended information bit sequence $\hat{a}'$ or the recovered extended CRC-encoded bit sequence $\hat{b}'$. More specifically, a sequence of L parity bits:

p=[$p_0, p_1, p_2, \ldots, p_{L-1}$] may be generated as a function of the input bit sequence s according to p=sG, where G is a K×L generator matrix of the CRC and the matrix multiplication is performed in GF(2). The $k^{th}$ row of the generator matrix G is obtained as the parity check bit sequence that results when computing a CRC for a sequence of K input bits, in which the $k^{th}$ bit is set to 1 and all other bits are set to 0. For example, in the case where the L=6-bit CRC generator polynomial:

$g_{CRC6}(D)=[D^6+D_5+1]$ is used to compute a CRC for the sequence of K=12 input bits, the generator matrix is given by:

$$G = \begin{bmatrix} 1 & 1 & 0 & 1 & 0 & 1 \\ 1 & 0 & 1 & 0 & 1 & 0 \\ 0 & 1 & 0 & 1 & 0 & 1 \\ 1 & 1 & 1 & 0 & 1 & 0 \\ 0 & 1 & 1 & 1 & 0 & 1 \\ 1 & 1 & 1 & 1 & 1 & 0 \\ 0 & 1 & 1 & 1 & 1 & 1 \\ 1 & 1 & 1 & 1 & 1 & 1 \\ 1 & 0 & 1 & 1 & 1 & 1 \\ 1 & 0 & 0 & 1 & 1 & 1 \\ 1 & 0 & 0 & 0 & 1 & 1 \\ 1 & 0 & 0 & 0 & 0 & 1 \end{bmatrix}.$$

Note that in the example sequence of A=12 information bits:

a=[0 1 1 0 0 1 1 1 0 1 1 0] from above, the $2^{nd}$, $3^{rd}$, $6^{th}$, $7^{th}$, $8^{th}$, $10^{th}$ and $11^{th}$ bits are set to 1. In this case, the sequence of L=6 parity bits:

p=[1 0 0 1 0 1] may be obtained as the XOR of the $2^{nd}$, $3^{rd}$, $6^{th}$, $7^{th}$, $8^{th}$, $10^{th}$ and $11^{th}$ rows of this generator matrix.

Note that the generator matrix behaves as a parity check matrix, when it is applied to a recovered CRC-encoded bit sequence $\hat{b}$, in order to obtain the syndrome $\tilde{p}$. In the example sequence of B=18 CRC-encoded bits:

b=[0 1 1 0 0 1 1 1 0 1 1 0 1 0 0 1 0 1] from above, the $2^{nd}$, $3^{rd}$, $6^{th}$, $7^{th}$, $8^{th}$, $10^{th}$, $11^{th}$, $13^{th}$, $16^{th}$ and $18^{th}$ bits are set to 1. As may be expected, the syndrome:

$\tilde{p}$=[0 0 0 0 0 0] may be obtained as the XOR of the $2^{nd}$, $3^{rd}$, $6^{th}$, $7^{th}$, $8^{th}$, $10^{th}$, $11^{th}$, $13^{th}$, $16^{th}$ and $18^{th}$ rows of the generator matrix for K=18 input bits, which is given by:

$$G = \begin{bmatrix} 1 & 0 & 0 & 1 & 1 & 0 \\ 0 & 1 & 0 & 0 & 1 & 1 \\ 1 & 1 & 1 & 0 & 0 & 1 \\ 1 & 0 & 1 & 1 & 0 & 0 \\ 0 & 1 & 0 & 1 & 1 & 0 \\ 0 & 0 & 1 & 0 & 1 & 1 \\ 1 & 1 & 0 & 1 & 0 & 1 \\ 1 & 0 & 1 & 0 & 1 & 0 \\ 0 & 1 & 0 & 1 & 0 & 1 \\ 1 & 1 & 1 & 0 & 1 & 0 \\ 0 & 1 & 1 & 1 & 0 & 1 \\ 1 & 1 & 1 & 1 & 1 & 0 \\ 0 & 1 & 1 & 1 & 1 & 1 \\ 1 & 1 & 1 & 1 & 1 & 1 \\ 1 & 0 & 1 & 1 & 1 & 1 \\ 1 & 0 & 0 & 1 & 1 & 1 \\ 1 & 0 & 0 & 0 & 1 & 1 \\ 1 & 0 & 0 & 0 & 0 & 1 \end{bmatrix}$$

It may be observed that in a generator matrix G corresponding to a particular number K' of input bits, the final K rows are equal to the generator matrix G corresponding to K input bits, where K≤K'. For example, the final 12 rows of the generator matrix G above for K=18 are equal to the generator matrix G above for K=12.

In cases where the bits of the CRC-encoded sequence b are interleaved in the source, the sink may perform CRC computation using the generator matrix G after applying a corresponding deinterleaving operation to obtain the recovered CRC-encoded bit sequence $\hat{b}$. Alternatively, the rows of the generator matrix G may be correspondingly interleaved and used to compute the CRC based on the interleaved version of the recovered CRC-encoded bit sequence $\hat{b}$. This enables the early termination of polar decoding [2] during the blind decoding in the Physical Downlink Control Channel (PDCCH) of 3GPP New Radio [1], for example.

In summary, it is known that a CRC computation can be equivalently described in a number of ways, including a generator polynomial such as:

$g_{CRC6}(D)=[D^6+D^5+1]$, a linear feedback shift register such as 101, or a generator matrix G such as the examples above.

Parallel processing may be used to implement CRC computation with a low latency. Here, a set of two or more parallel processors may operate under the direction of a controller, to process two or more bits at a time and compute the corresponding CRC bits within a set of registers. In some known implementations, the processors may perform a multiplication of the bits with a binary representation of the generator polynomial [3]. However, multiplications are relatively complex operations, compared with XOR operations for example, and a need exists for an improved CRC approach, for example when using parallel processing.

SUMMARY OF THE INVENTION

The present invention provides a method for low latency CRC computation using processing. In particular, the present invention details memory mappings and introduces Look-Up Tables (LUTs) that eliminate the requirement for permutation networks between the memory and the processors. Specific embodiments of the invention are set forth in the dependent claims. These and other aspects of the invention will be apparent from and elucidated with reference to the embodiments described hereinafter.

In a first aspect of the invention, a cyclic redundancy check, CRC, decoder circuit includes: an input for receiving an input stream that has an input bit sequence comprising information bits and CRC bits from a predefined CRC generator polynomial that encoded the input bit sequence; and at least one processor configured to perform a CRC decode computation of the input bit sequence. The at least one processor is configured to: apply an inverse processing operation of the predefined CRC generator polynomial that encoded the input bit sequence to produce a data set; compute a CRC syndrome from the data set; and determine whether the CRC syndrome contains any one-valued bits indicative of a CRC error.

In an optional example, CRC decoder circuit may include a Look Up Table, LUT, operably coupled to the at least one processor and comprising a plurality of addresses, wherein at least one of the plurality of addresses is configured to store one or more rows of a CRC generator matrix that are aligned with the input bits of the input stream. In this manner, and owing to the alignment of the input stream with the rows of the CRC generator matrix, the single parity bit sequence may be obtained without complex routing that would be required to enable any input bit to be combined with any row of the CRC generator matrix.

In an optional example, at least one processor may be configured to first combine LUT data with the input stream by using one or more bits of the aligned input stream to mask the one or more rows of the CRC generator matrix stored in the LUT. In this manner, the rows of the generator matrix that do not contribute to the computed parity bits can be eliminated.

In an optional example, the CRC decoder circuit may further include: a Look Up Table, LUT, operably coupled to at least two processors and comprising a plurality of addresses wherein at least one of the plurality of addresses is configured to store two or more rows of a CRC generator matrix that are aligned to input bits of the input stream; wherein the at least two processors may be configured to: first combine LUT data with the input stream to generate two or more intermediate parity bit sequences; and second combine the two or more intermediate parity bit sequences) into a single parity bit sequence. In this manner, the number of steps required to complete the CRC computation may be reduced through the use of parallel processing.

In an optional example, the two or more rows of the CRC generator matrix stored in the LUT may be aligned by zero padding the input bit sequence. In this manner, the zero padding repositions the bits within the input bit sequence so that they are aligned with the corresponding rows of the CRC generator matrix.

In an optional example, alignment with the two or more rows of the CRC generator matrix stored in the LUT may include one of: the at least two processors receiving the input stream with zero padding that provides an input bit sequence length; or wherein the input bit sequence is of a first length and at least one of the two or more processors zero pads the input bit sequence. In this manner, the bits of the input bit sequence may be distributed evenly between the P parallel processors, allowing all parallel processors to operate in the same manner and without any processor requiring special independent control.

In an optional example, a number of rows in the CRC generator matrix stored in the LUT may be equal to or exceeds a maximum supported input bit sequence length ($K_{max}$) divided by the number P of the one or more processors. In this manner, a single LUT may be used to enable the CRC processing of any supported input bit sequence length, avoiding the requirement for different CRC processing mechanisms to be used for different input bit sequence lengths.

In an optional example, the CRC decoder circuit may further include a controller operably coupled to and configured to control the at least one processor and the LUT. In this manner, the controller can coordinate the operations of the parallel processors and the reading of rows of the CRC generator matrix from the LUT.

In an optional example, the generation of two or more intermediate parity bit sequences may include multiple, $\lceil K/P \rceil$, first combinations of data, where K is a length of the input bit sequence. In this manner, the number of steps required to process the K bits of the input sequences is divided by the number of parallel processors, minimizing the processing steps and maximizing the processing efficiency.

In an optional example, the second combination of the two or more intermediate parity bit sequences may be performed multiple, $\lceil \log_2(P) \rceil$, times to generate a single parity bit sequence, where P is a number of the two or more processors. In this manner, the number of steps required to process the K bits of the input sequences is reduced to the logarithm of the number of parallel processors, minimizing the processing steps and maximizing the processing efficiency.

In an optional example, wherein the L bits in at least one of the rows of the generator matrix (G) may be padded with zero valued bits to increase the bit sequence to a second length (L'). In this manner, the length may be adjusted to one that is more convenient for storage in conventional memory architectures, such as a 32-bit RAM.

In a second aspect of the invention, a communication unit comprising the CRC computation circuit according to the first aspect is described.

In a third aspect of the invention, a method for cyclic redundancy check, CRC, is described. The method includes receiving an input stream that has an input bit sequence comprising information bits and CRC bits from a predefined CRC generator polynomial that encoded the input bit sequence; and performing a CRC decode computation of the input bit sequence. The method further includes applying an inverse processing operation of the predefined CRC generator polynomial that encoded the input bit sequence to produce a data set; computing a CRC syndrome from the data set; and determining whether the CRC syndrome contains any one-valued bits indicative of a CRC error.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

FIG. 1 illustrates a known shift register implementation of a L=6-bit CRC generator polynomial $g_{CRC6}(D)=[D^6+D^5+1]$ of a source circuit and provides an example of how the sequence of A=12 information bits a=[0 1 1 0 0 1 1 1 0 1 1 0] may be converted into the sequence of L=6 parity bits p=[1 0 0 1 0 1], where K=A and s=a.

FIG. 2 illustrates a known shift register implementation of a L=6-bit inverse CRC generator polynomial $g_{invCRC6}(D)=[D^6+D+1]$ of a source circuit and provides an example of how the sequence of A=12 information bits a=[0 1 1 0 0 1 1 1 0 1 1 0] may be converted into the sequence of L=6 parity bits p=[1 0 0 1 1 1], where K=A and s=a.

FIG. 4 also provides an example of how the sequence of A=9 information bits a=[1 1 0 1 1 0 0 1 1] may be converted into the sequence of L=6 parity bits p=[0 0 0 1 0 1], where: K=A and s=a.

FIG. 6 also provides an example of how the sequence of B=18 CRC-encoded bits b=[0 1 1 0 0 1 1 1 0 1 1 0 1 0 0 1 1 1] may be converted into the sequence of L=6 syndrome bits $\tilde{p}$=[0 0 0 0 0 0], where K=B, s=b and $\tilde{p}$=p.

FIG. 7 also provides an example of how the sequence of B=15 CRC-encoded bits b=[1 1 0 1 1 0 0 1 1 0 0 0 1 0 1] may be converted into the sequence of L=6 syndrome bits $\tilde{p}$=[0 0 0 0 0 0], where K=B, s=b and $\tilde{p}$=p.

DETAILED DESCRIPTION

Figure 3:
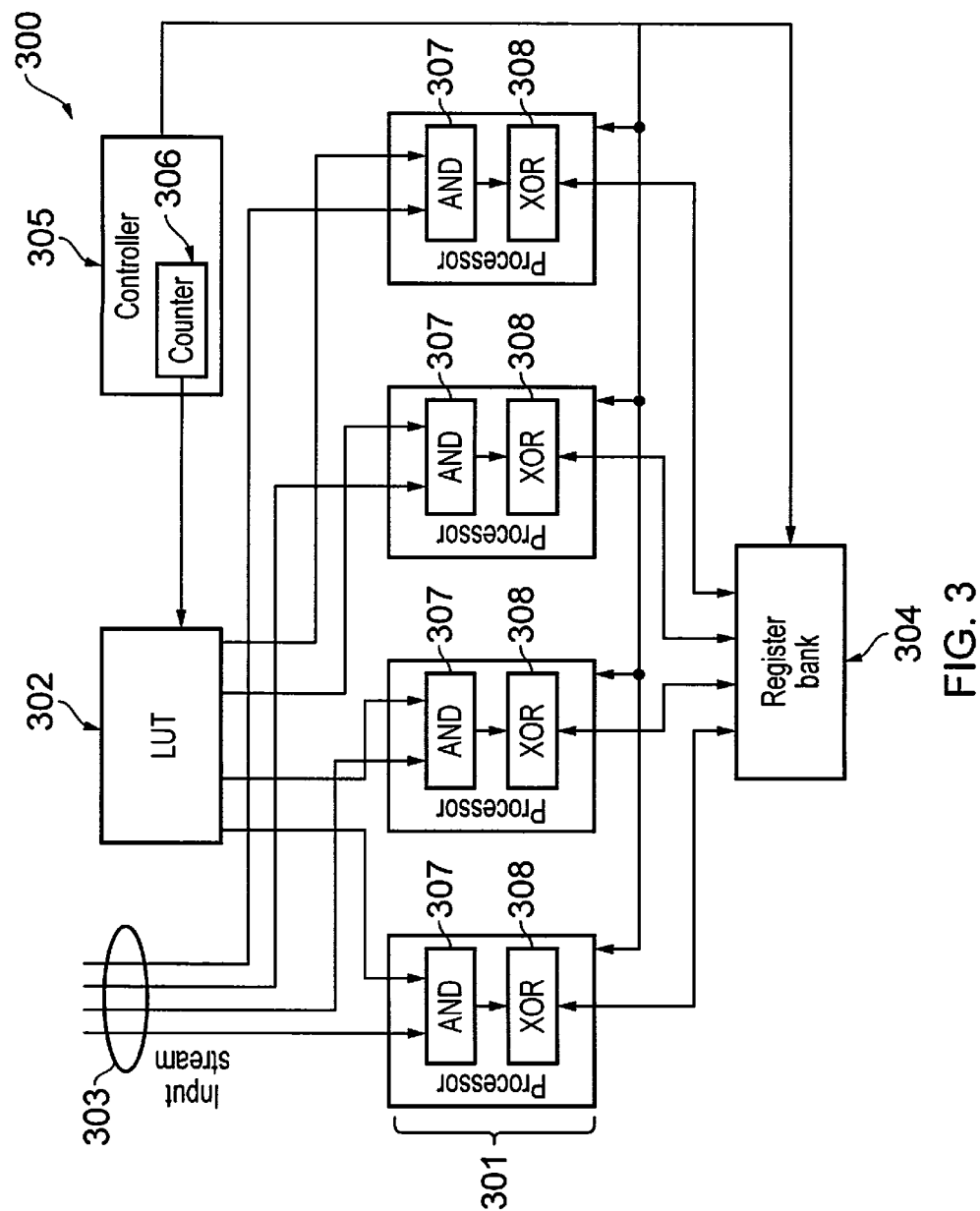
FIG. 3 illustrates an example embodiment of the present invention for the case where P=4.

Parallel Processing of CRC Computation Using a Generator Matrix According to a First Aspect Referring now to FIG. 3, an example cyclic redundancy check, CRC, computation circuit 300 of the present invention, for the case where P=4, is illustrated. A first aspect of the present invention aim to address the challenge of efficiently performing an L-bit CRC computation for successive sequences of input bits using a set of P parallel processors 301. Here, the number of parallel processors adopts a fixed value P, which may be chosen at design-time as any value greater than or equal to '2'. By contrast, the number of bits $K \in [1, K_{max}]$ in successive input bit sequences s may vary at run-time, where the maximum input bit sequence length $K_{max}$ may be specified in the standard being implemented. The parallel processors 301 are aided by a Look Up Table (LUT) 302, an input stream 303, a register bank 304 and a controller 305, as illustrated in FIG. 3 for an example where P=4. In other examples, the number of parallel processors 301 may vary.

In steps of a CRC computation process, a number (and in some examples each) of the P processors 301 is/are capable of computing the AND 307 of a set of L' bits with a masking bit, then computing the XOR 308 of the resultant set of L' bits with another set of L' bits, where L'≥L may be chosen as a value that is convenient to the implementation, such as 8, 16 or 32 bits, for example. A number of the processor is/are also capable of optionally performing only one or neither of these AND 307 and XOR 308 operations during some steps. In some examples, each step may correspond to at least one clock cycle in a hardware implementation. In some examples, each processor may be a processing unit in a Single Instruction Multiple Data (SIMD) processor. Note that rather than using an AND 307 operation, the masking operation could be achieved in an alternative arrangement by using clock or power gating to disable the passing of the set of L' bits, when the masking bit is set to zero. Hereafter, the use of two or more bits of the input stream 303 to mask aligned two or more rows of a CRC generator matrix stored in the LUT 302, and thereby generate two or more intermediate parity bit sequences, encompasses such clock or power gating techniques that disable the passing of sets of bits.

Some examples of the present invention exploit the observation that in a generator matrix G corresponding to $K_{max}$ input bits, the final K rows are equal to the generator matrix G corresponding to K input bits, where $K \leq K_{max}$. Owing to this, successive CRC computation processes may be completed with the aid of the same LUT 302 of FIG. 3, which may be implemented in Read Only Memory (ROM) or in a Random Access Memory (RAM), for example. Here, a specially-configured ROM may be used to store the LUT in a dedicated hardware implementation of the present invention, whilst a RAM may be used to store the LUT 302 in an implementation using a general purpose processor. More specifically, this LUT 302 may store the $K_{max}$ rows of the generator matrix G corresponding to the maximum supported number of input bits $K_{max}$.

Figure 4:
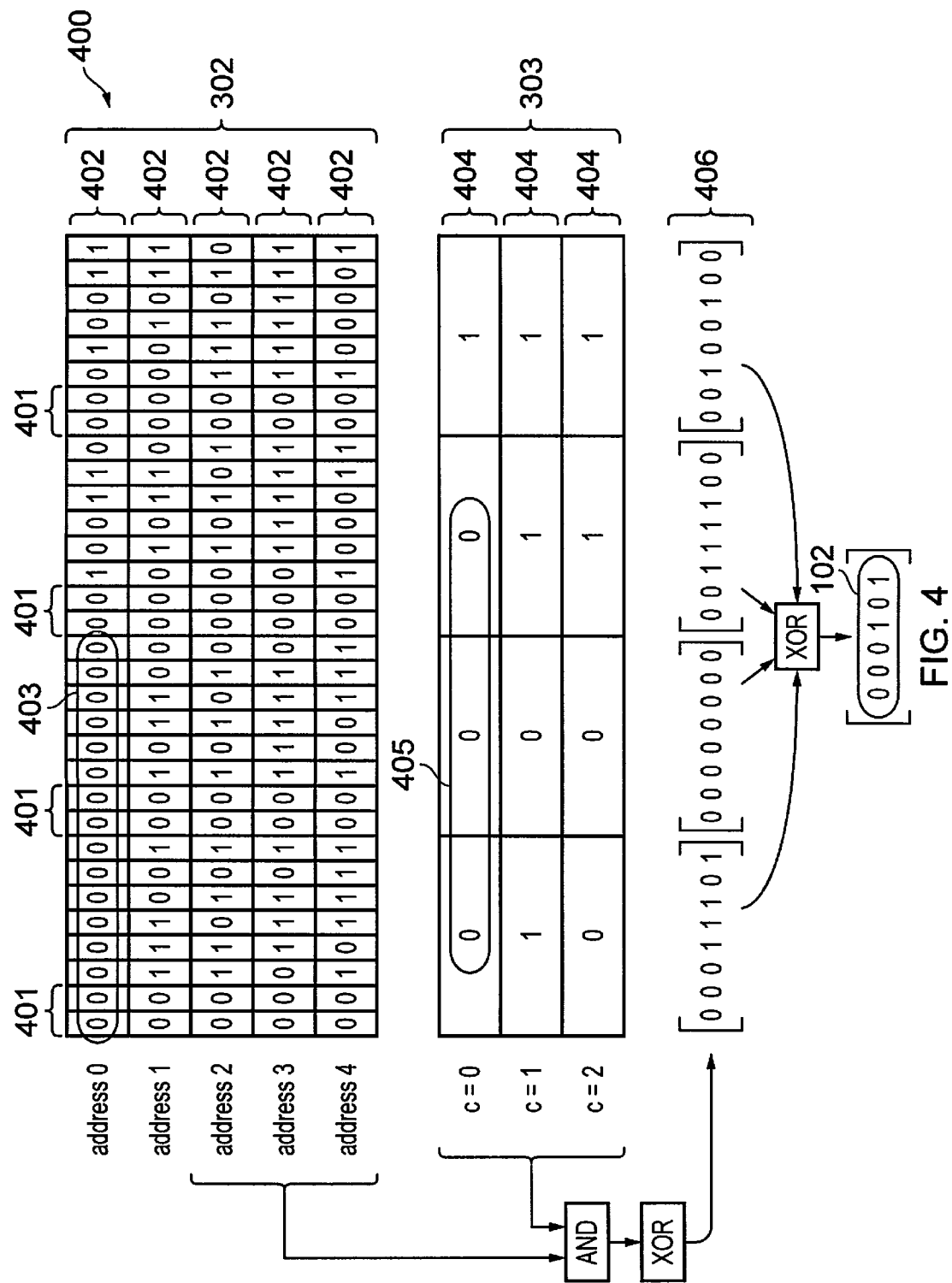
FIG. 4 illustrates a storage of a generator matrix G corresponding to the L=6-bit CRC generator polynomial $g_{CRC6}(D)=[D^6+D^5+1]$ in a LUT, in an example embodiment of the present invention, where: L'=8, $K_{max}$=18 and P=4.

Referring now to FIG. 4, the storage of the generator matrix G 400 corresponding to the L=6-bit CRC generator polynomial:

$g_{CRC6}(D)=[D^6+D^5+1]$ in a LUT, is illustrated in an example embodiment of the present invention where L'=8, $K_{max}$=18 and P=4. FIG. 4 also provides an example of how the sequence of A=9 information bits: a=[1 1 0 1 1 0 0 1 1] may be converted into the sequence of L=6 parity bits:
p=[0 0 0 1 0 1], where K=A and s=a.

As illustrated, in some examples, the L bits in each row of the generator matrix G stored in the LUT may be optionally padded with zero-valued bits 401 in order to increase its length to L' bits. For example, in the case where the rows of the generator matrix G comprise L=24 bits, they may be padded with 8 zero-valued bits, in order to increase their length to L'=32 bits and allow their storage in a 32-bit RAM. In some examples, the padding bits may be added to the beginning of each row of the generator matrix G, while they may be added to the end of each row in other examples. Rather than applying padding to each row of the generator matrix G stored in the LUT, it is envisaged that, in an alternative arrangement, padding may be added to the rows after they have been read from the LUT, at some point during their subsequent processing.

The $K_{max}$ rows of the generator matrix G are stored in the LUT 302 in sets of P rows 402. In cases where $K_{max}$ is not divisible by P, an additional set of mod(-$K_{max}$, P) rows 403 may be prepended to the top of the generator matrix G, in order to extended its number of rows to a multiple of P. These additional rows may contain any arbitrary bit values. Each of the $\lceil K_{max}/P \rceil$ successive sets of P rows (and their padding bits) 402 from the (extended) generator matrix may be concatenated and stored in successive addresses of the LUT 302, where the first set of P rows may be indexed by the address 0. Here, $\lceil x \rceil$ is the smallest integer greater than or equal to x.

In alternative arrangements, the bits of each (padded) row of the generator matrix G may be reversed before they are concatenated. In alternative arrangements, a number of the $\lceil K_{max}/P \rceil$ successive sets of P rows 402 from the (extended) generator matrix G may be stored in other addresses within the LUT 302. FIG. 4 illustrates the storage of the generator matrix G corresponding to the L=6-bit CRC generator polynomial:

$g_{CRC6}(D)=[D^6+D^5+1]$ in a LUT 302, for the case of L'=8, $K_{max}$=18 and P=4.

Referring also to FIG. 3, the input stream 303 of FIG. 3 is used to provide the successive input bit sequences s. The bits of an input sequence s are provided by the input stream 303 in a manner that is aligned with the arrangement of the rows of the generator matrix G in the LUT 302. As will be detailed below, this alignment avoids the requirement for complex routing between the input stream 303, LUT 302 and processors 301. More specifically, the alignment is achieved by arranging the K bits in an input bit sequence s into sets of P bits 404 when they are provided by the input stream 303. In cases where K is not divisible by P, the alignment may be achieved by prepending a set of mod(-K, P) zero-valued filler bits 405 to the input bit sequence s, in order to extend its length to a multiple of P. A number of the $\lceil K/P \rceil$ successive sets of P bits 404 from the (extended) input bit sequence may be provided by the input stream 303 in successive steps of the CRC computation process. Note that in some arrangements, the $\lceil K/P \rceil$ successive sets of P bits (404) from the (extended) input bit sequence provided by the input stream may be read from successive addresses of a RAM, having a capacity of at least $\lceil K_{max}/P \rceil$ addresses.

Figure 5:
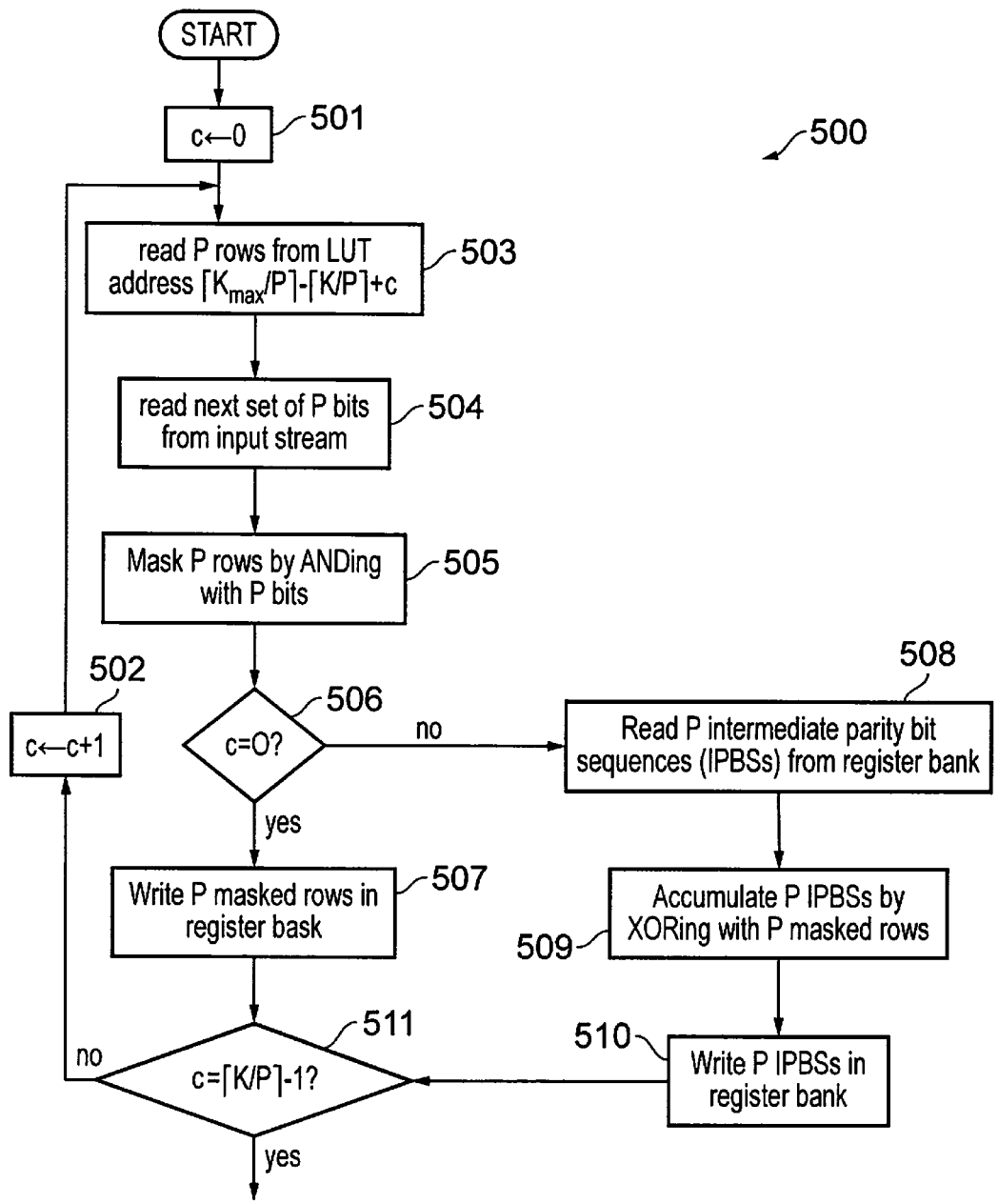
FIG. 5 illustrates a flow chart for an operation of a controller in an example embodiment of the present invention.
Figure 5:
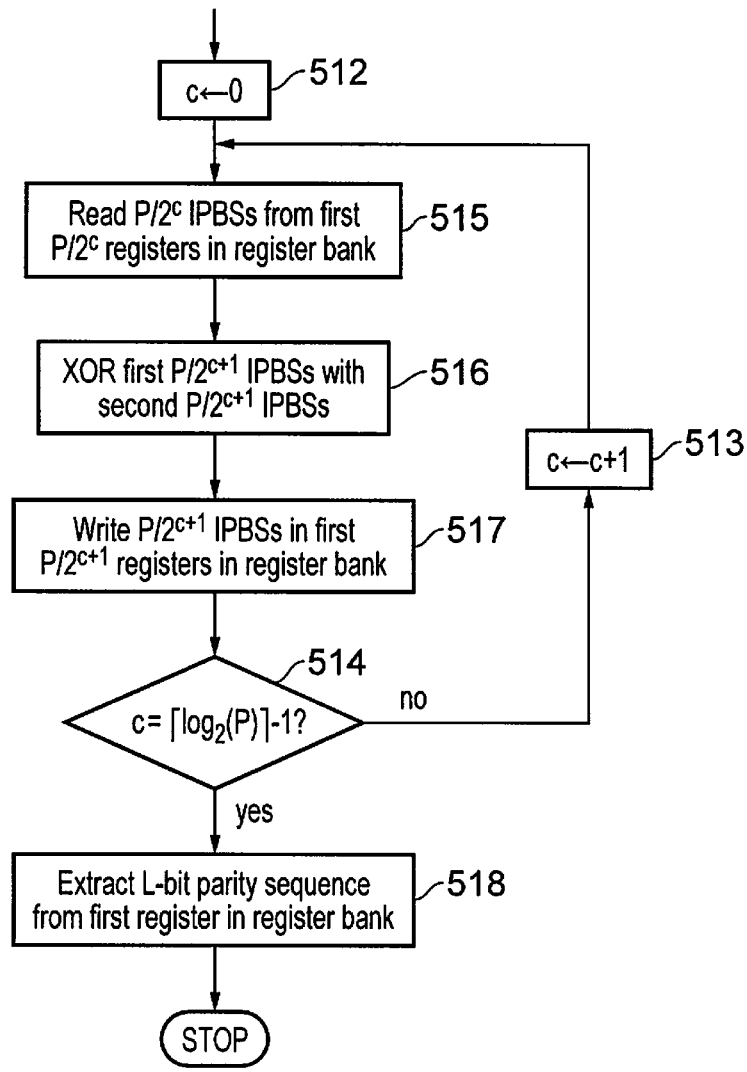

A CRC computation process for a K-bit sequence of input bits s is completed under the direction of the controller 305 of FIG. 3, using two sets of steps, as shown in the flowchart of FIG. 5. A set of P intermediate sequences 406 of L parity bits may be computed during a first set of $\lceil K/P \rceil$ steps. Then during a second set of $\lceil \log_2(P) \rceil$ steps, the P intermediate parity bit sequences 406 may be combined into the desired single sequence of L parity bits p=[$p_0, p_1, p_2, \ldots, p_{L-1}$] 102.

Referring now to FIG. 5, with reference to the previous discussion of FIG. 3 and FIG. 4, a flow chart 500 illustrates an operation of the controller in accordance with an example embodiment of the present invention. During the first set of $\lceil K/P \rceil$ steps, the P intermediate parity bit sequences 406 are accumulated in the register bank 304 of FIG. 3. This register bank 304 comprises P registers, each of which can store L' bits. A counter c 306 within the controller 305 is initialised 501 to a value of 0 at the start of the first step in the set of $\lceil K/P \rceil$ steps 511 and this counter c 306 is incremented 502 at the start of a number of successive steps thereafter. In a number of the (say, each) steps, a set of P rows 402 of the generator matrix G are read 503 from the address ($\lceil K_{max}/P \rceil - \lceil K/P \rceil + c$) of the LUT 302. Meanwhile, the set of P bits 404 having the index c from the (extended) input bit sequence are provided 504 by the input stream 303.

In each of the first set of $\lceil K/P \rceil$ steps, each of the P rows of the generator matrix G provided by the LUT 302 is masked 505 by the corresponding one of the P input bits provided by the input stream 303. More specifically, each of the P processors 301 performs the corresponding one of these P masking operations by ANDing 307 each of the L' bits in the corresponding row of the generator matrix G with the corresponding input bit. Owing to the alignment between the arrangement of the P input bits in the input stream 303 and the P rows of the generator matrix G in the LUT 302, this masking can be advantageously performed without the requirement for complex routing between the input stream 303, LUT 302 and processors 301.

Note that in the first of the $\lceil K/P \rceil$ steps, in this example and when c=0, the set of P input bits 404 provided by the input stream 303 will include mod(-K,P) prepended zero-valued filler bits 405, in cases where K is not a multiple of P. As described above, these zero-valued filler bits are used to achieve the alignment and act to mask the corresponding mod(-K, P) rows from the set of P rows 402 of the generator matrix G that are read from the LUT 302. In this case, these mod(-K, P) masked rows will precede the last K rows of the generator matrix G, thereby advantageously ensuring that only the final K rows of the generator matrix G will have the opportunity to influence the P intermediate parity bit sequences 406. As described above, the final K of the $K_{max}$ rows in the generator matrix G stored in the LUT 302 are equal to the generator matrix G corresponding to K input bits. In this way, the same LUT 302 storing the generator matrix G corresponding to $K_{max}$ input bits can be advantageously reused for all values of K, even if K is not a multiple of P.

During the first step 506 among the first set of $\lceil K/P \rceil$ steps when: c=0, the P masked rows of the generator matrix G obtained during that step are written 507 to the register bank 304, in order to initialize the P intermediate parity bit sequences 406. In a number of subsequent steps when: $0<c<\lceil K/P \rceil$, the P intermediate parity bit sequences 406 are read 508 from the register bank 304 and provided to the P processors 301, where they are XORed 308 509 with the P masked rows of the generator matrix G obtained during that step. The results are then written 510 back to the register bank 304, in order to accumulate the P intermediate parity bit sequences 406. Note that the action of the counter c 306 is to read the $\lceil K/P \rceil$ addresses in the LUT 302 in ascending order, in correspondence with the provision of sets of P input bits 404 by the input stream 303 in their natural ordering. However, in other arrangements, the input stream 303 could provide the sets of P input bits 404 in any order and the addresses of the LUT could be read in the corresponding order. FIG. 4 provides an example of how the sequence of A=9 information bits:

a=[1 1 0 1 1 0 0 1 1] 303 may be converted into a set of P=4 intermediate parity bit sequences 406.

During the second set of $\lceil \log_2(P) \rceil$ steps 514, the register bank 304 is used to combine the P intermediate parity bit sequences 406 into the single desired parity bit sequence 102. The counter c 306 is initialised 512 to a value of 0 at the start of the first step in the set of $\lceil \log_2(P) \rceil$ steps and this counter c 306 is incremented 513 at the start of successive steps thereafter. In a number of the steps when $0 \leq c < \lceil \log_2(P) \rceil$, a set of $P/2^c$ intermediate parity bit sequences are read 515 from the first $P/2^c$ registers in the bank 304 of P register. This set of $P/2^c$ intermediate parity bit sequences is then decomposed into two sub-sets, each comprising $P/2^{c+1}$ intermediate parity bit sequences. Each of the intermediate parity bit sequences in the first sub-set of $P/2^{c+1}$ intermediate parity bit sequences is then XORed 308 516 with the corresponding intermediate parity bit sequence from the second sub-set of $P/2^{c+1}$ intermediate parity bit sequences. The resultant set of $P/2^{c+1}$ XORed 308 intermediate parity bit sequences is then written 517 to the first set of $P/2^{c+1}$ registers in the bank 304 of P registers.

Following the completion of the last step in the second set of $\lceil \log_2(P) \rceil$ steps, the P intermediate parity bit sequences will have been combined into the single desired parity bit sequence, which is stored in the first register in the bank 304 of P registers. The L bits of this parity bit sequence p=[$p_0$, $p_1$, $p_2$, ..., $p_{L-1}$] may then be extracted 518 from the L' bits of the register, by removing the zero-valued padding bits.

Note that in the approach described here, the P intermediate parity bit sequences are successively combined into the first of the P registers in the register bank 304.

In alternative arrangements, the P intermediate parity bit sequences may be successively combined into any of the P registers in the register bank 304. For example, and referring back to FIG. 4 an example of how a set of P=4 intermediate parity bit sequences 406 may be combined into a sequence of L=6 parity bits p=[0 0 0 1 0 1] 102, where K=A and s=a is provided.

Figure 6:
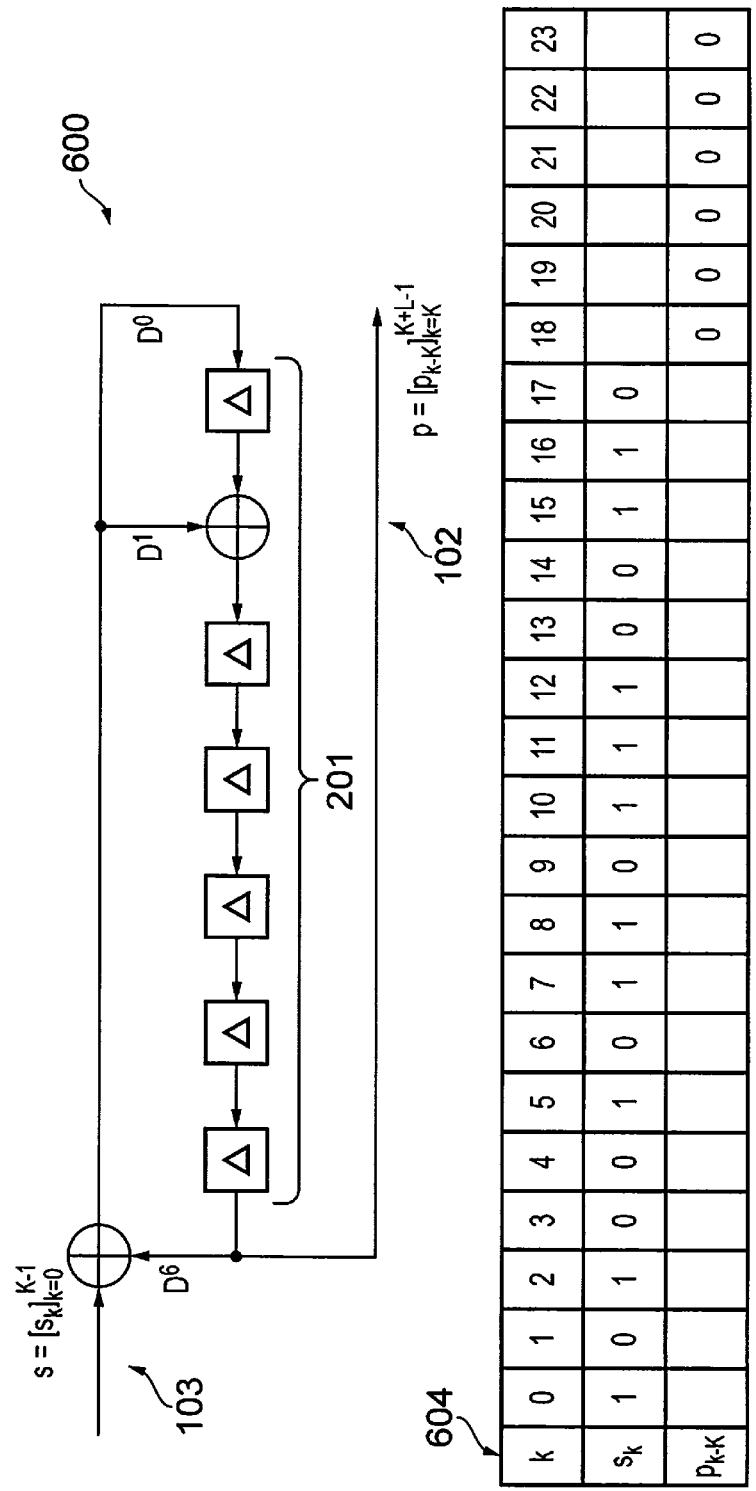
FIG. 6 illustrates a shift register implementation of a L=6-bit inverse CRC generator polynomial $g_{invCRC6}(D)=[D^6+D+1]$ of a sink circuit, used to calculate a syndrome for a CRC-encoded bit sequence generated using a L=6-bit CRC generator polynomial $g_{CRC6}(D)=[D^6+D^5+1]$ of a source circuit.

Syndrome Computation Using an Inverse Generator Matrix and its Associated Parallel Processing in a First Aspect of the Invention Referring now to FIG. 6, a shift register implementation 600 of a L=6-bit inverse CRC generator polynomial:

$g_{invCRC6}(D)=[D^6+D+1]$ of a sink circuit, used to calculate a syndrome for a CRC-encoded bit sequence generated using a L=6-bit CRC generator polynomial:

$g_{CRC6}(D)=[D^6+D_5+1]$ of a source circuit, is illustrated. FIG. 6 also provides an example of how the sequence of B=18 CRC-encoded bits:

b=[0 1 1 0 0 1 1 1 0 1 1 0 1 0 0 1 1 1] may be converted into the sequence of L=6 syndrome bits:

$\tilde{p}$=[0 0 0 0 0 0], where K=B, s=b and $\tilde{p}$=p.

Figure 1:
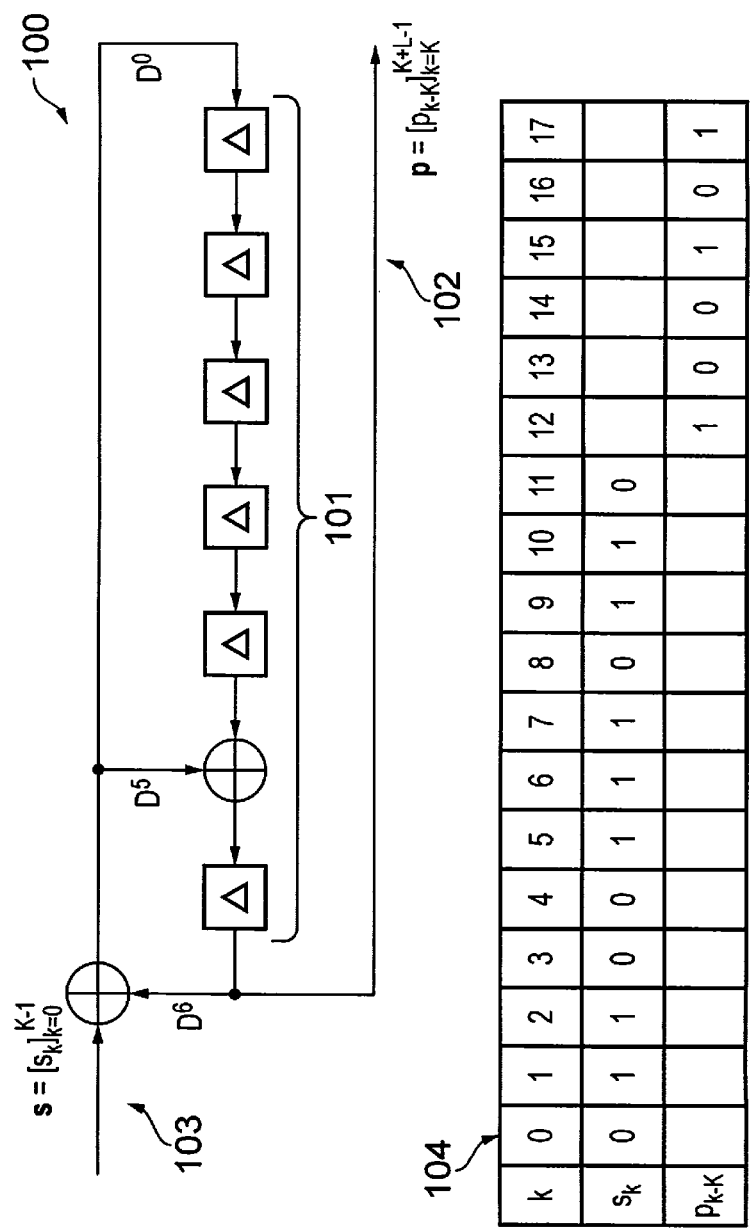
Figure 2:
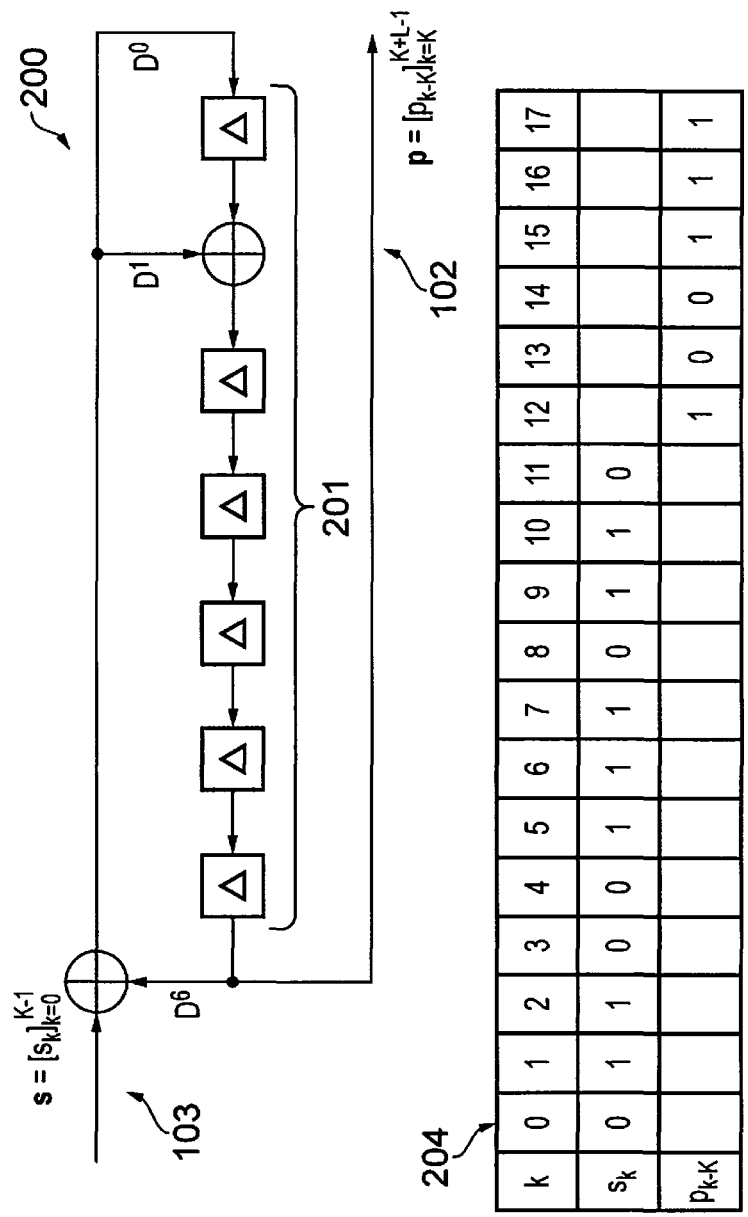

In a sink, the CRC-computation of a syndrome $\tilde{p}$ for a recovered CRC-encoded bit sequence $\hat{b}$ may be performed using the inverse of a CRC generator polynomial, even if the CRC-computation was performed using the regular CRC generator polynomial in the source. More specifically, a shift register representation of the inverse CRC generator polynomial may be used to compute a sequence of L syndrome bits:

$\tilde{p}$=[$\tilde{p}_0$, $\tilde{p}_1$, $\tilde{p}_2$, ..., $\tilde{p}_{L-1}$] as a function of all B=A+L recovered CRC-encoded bits in the sequence $\hat{b}$. However, the B bits of the sequence $\hat{b}$ must be processed in reverse order, when computing the syndrome $\tilde{p}$ using a shift register representation of the inverse CRC generator polynomial. If this syndrome $\tilde{p}$ does not equal a sequence of L 0-valued bits, then errors have been detected. This is illustrated as a sequence of L parity bits 102 in FIG. 6 where the inverse CRC generator polynomial:

$g_{invCRC6}(D)=[D^6+D+1]$ is used to compute the L=6-bit syndrome $\tilde{p}$ for the error-free B=18-bit CRC-encoded sequence b of FIG. 1, where: K=B, $\tilde{p}$=p 102 and s=reverse (b) is obtained by reversing the order of the bits in b 103. Note that the syndrome $\tilde{p}$ comprises L=6 zero-valued bits, confirming that b is error-free.

Alternatively, the CRC-computation of an L-bit syndrome $\tilde{p}$ for a sequence of B recovered CRC-encoded bits $\hat{b}$ may be performed using a K×L generator matrix G for the inverse CRC generator polynomial, where: K=B. Here, the order of the rows in this generator matrix G may be reversed in order to obtain the inverse generator matrix G'. This advantageously allows the B bits of the sequence $\hat{b}$ to be processed in a forward order, rather than a reversed order. More specifically, the syndrome may be computed as: $\tilde{p}=\hat{b}G'$. In the example sequence of B=18 CRC-encoded bits:

b=[0 1 1 0 0 1 1 1 0 1 1 0 1 0 0 1 0 1] from above, the $2^{nd}$, $3^{rd}$, $6^{th}$, $7^{th}$, $8^{th}$, $10^{th}$, $11^{th}$, $13^{th}$, $16^{th}$ and $18^{th}$ bits are set to 1. As may be expected, the L=6-bit syndrome: $\tilde{p}$=[0 0 0 0 0 0] may be obtained as the XOR of the $2^{nd}$, $3^{rd}$, $6^{th}$, $7^{th}$, $8^{th}$, $10^{th}$, $11^{th}$, $13^{th}$, $16^{th}$ and $18^{th}$ rows of the K×L inverse generator matrix for the inverse CRC generator polynomial $g_{invCRC6}(D)=[D^6+D+1]$ with K=18, which is given by:

$$G' = \begin{bmatrix} 0 & 0 & 0 & 0 & 1 & 1 \\ 0 & 0 & 0 & 1 & 1 & 0 \\ 0 & 0 & 1 & 1 & 0 & 0 \\ 0 & 1 & 1 & 0 & 0 & 0 \\ 1 & 1 & 0 & 0 & 0 & 0 \\ 1 & 0 & 0 & 0 & 1 & 1 \\ 0 & 0 & 0 & 1 & 0 & 1 \\ 0 & 0 & 1 & 0 & 1 & 0 \\ 0 & 1 & 0 & 1 & 0 & 0 \\ 1 & 0 & 1 & 0 & 0 & 0 \\ 0 & 1 & 0 & 0 & 1 & 1 \\ 1 & 0 & 0 & 1 & 1 & 0 \\ 0 & 0 & 1 & 1 & 1 & 1 \\ 0 & 1 & 1 & 1 & 1 & 0 \\ 1 & 1 & 1 & 1 & 0 & 0 \\ 1 & 1 & 1 & 0 & 1 & 1 \\ 1 & 1 & 0 & 1 & 0 & 1 \\ 1 & 0 & 1 & 0 & 0 & 1 \end{bmatrix}.$$

It may be observed that in an inverse generator matrix G' corresponding to a particular number K' of input bits, the first K rows are equal to the inverse generator matrix G' corresponding to K input bits, where K≤K'. For example, the first 12 rows of the generator matrix G' above for K=18 are equal to the inverse generator matrix G' for K=12. This is in contrast to a regular generator matrix G corresponding to a particular number K' of input bits, where it is the final K rows that are equal to the generator matrix G corresponding to K input bits, where K≤K'.

Figure 7:
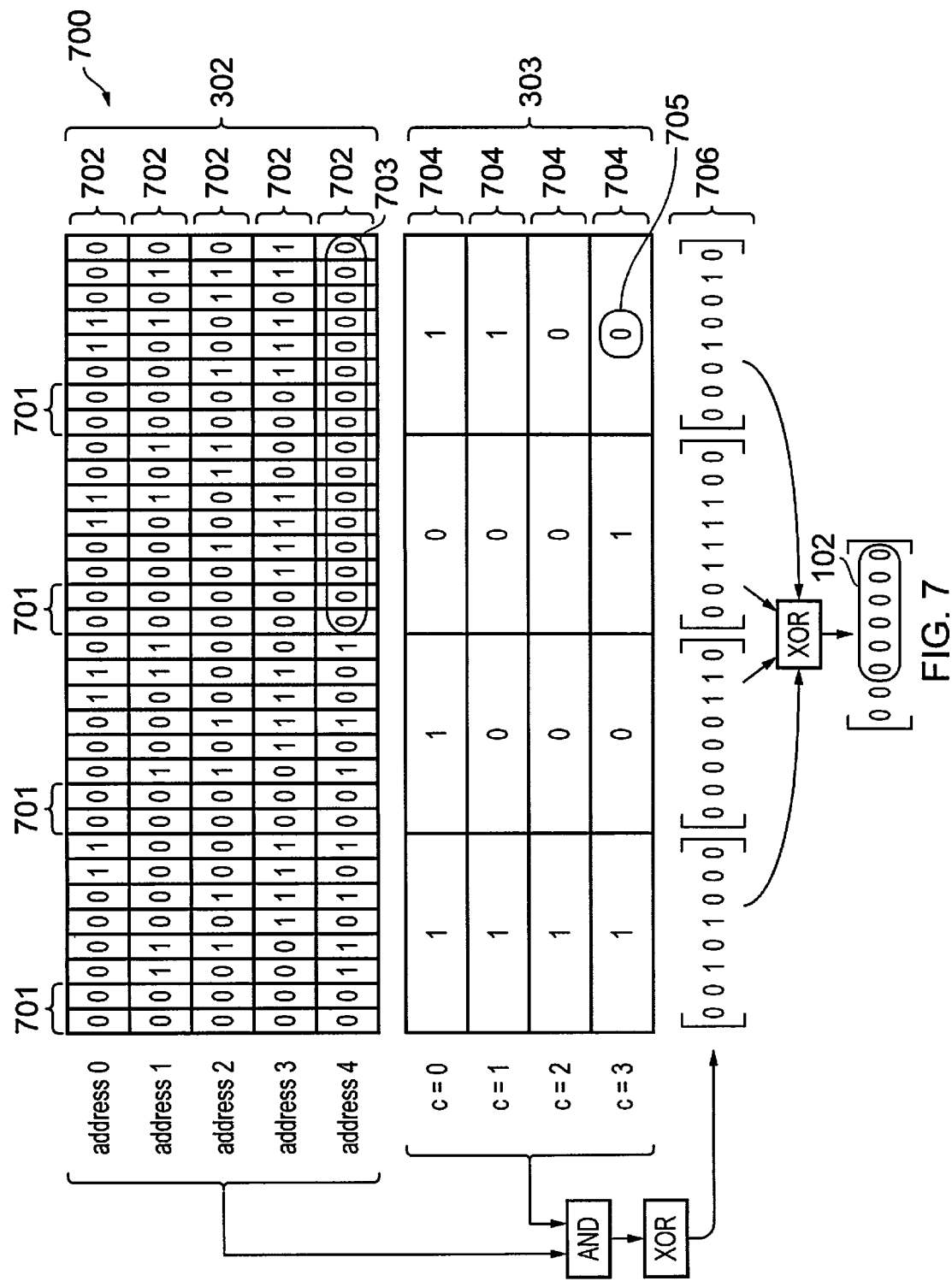
FIG. 7 illustrates the storage of the inverse generator matrix G' corresponding to the L=6-bit inverse CRC generator polynomial $g_{invCRC6}(D)=[D^6+D+1]$ in a LUT, in an example embodiment of the present invention where L'=8, $K_{max}$=18 and P=4.

In some examples of the invention, this property of the inverse generator matrix G' may be exploited to adapt the scheme of FIG. 3 so that the recovered CRC-encoded bit sequence $\hat{b}$ does not need to be prepended with zero-valued filler bits 405, when used as the input bit sequence s. This advantageously allows the CRC-encoded bit sequence $\hat{b}$ to be stored in a more convenient format, which can be directly output if the CRC check is successful. As above, the LUT 302 of FIG. 3 stores the $K_{max}$ rows of the inverse generator matrix G' corresponding to the maximum supported number of input bits $K_{max}$, while the input stream 303 of FIG. 3 provides the K bits of the input bit sequence s. However, rather than prepending a set of mod($-K_{max}$, P) arbitrary rows 403 to the top of the generator matrix when $K_{max}$ is not divisible by the number of parallel processors P, these additional rows 703 are appended to the bottom of the inverse generator matrix G', as illustrated in FIG. 7. Referring now to FIG. 7, the storage of the inverse generator matrix G' 700 corresponding to the L=6-bit inverse CRC generator polynomial:

$g_{invCRC6}(D)=[D^6+D+1]$ in a LUT, is illustrated in accordance with an example embodiment of the present invention, where L'=8, $K_{max}$=18 and P=4. FIG. 7 also provides an example of how the sequence of B=15 CRC-encoded bits:

b=[1 1 0 1 1 0 0 1 1 0 0 0 1 0 1] may be converted into the sequence of L=6 syndrome bits:

$\tilde{p}$=[0 0 0 0 0 0], where: K=B, s=b and $\tilde{p}$=p.

As illustrated in FIG. 7, rather than prepending a set of mod(−K, P) zero-valued filler bits 405 to the beginning of the input bit sequence s when K is not divisible by the number of parallel processors P, these additional filler bits 705 are appended to the end of the input bit sequence s. As above, a number of successive sets of P rows 702 of the (extended) inverse generator matrix are stored in successive addresses of the LUT 302, where the first set of P rows may be indexed by the address 0, respectively. Likewise, a number of successive sets of P bits 704 of the (extended) input bit sequence are provided by the input stream 303 in successive steps of the CRC computation.

FIG. 7 illustrates the storage of the inverse generator matrix G' corresponding to the L=6-bit inverse CRC generator polynomial $g_{invCRC6}(D)=[D^6+D+1]$ in a LUT 302, for the case of L'=8, $K_{max}$=18 and P=4. As above, a counter c 306 is initialised to a value of 0 at the start of the first step in the set of $\lceil K/P \rceil$ steps and this counter c 306 is incremented at the start of a number of (say, each) successive steps thereafter. However, rather than reading a set of P rows 402 of the generator matrix from the address ($\lceil K_{max}/P \rceil - \lceil K/P \rceil + c$) of the LUT 302 in each step, a set of P rows 702 of the inverse generator matrix G' are read from the address c instead. Meanwhile, a set of P bits 704 having the index c from the (extended) input bit sequence are provided by the input stream 303, as above. Besides these differences, the operation of the scheme of FIG. 7 proceeds as described above.

Figure 9:
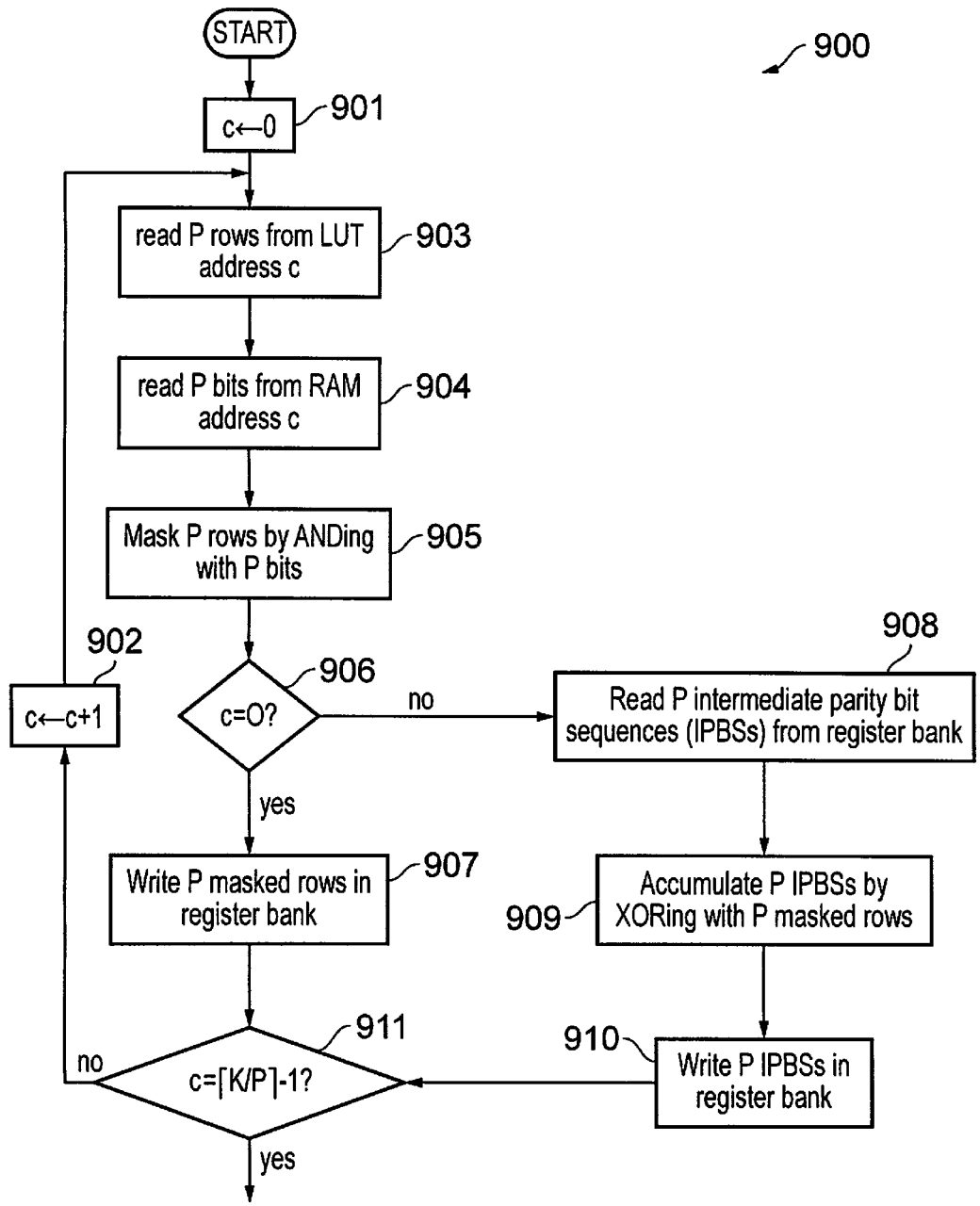
FIG. 9 illustrates a flow chart for an operation of a controller in an example embodiment of the present invention, operating on the basis of the inverse generator matrix G'.
Figure 9:
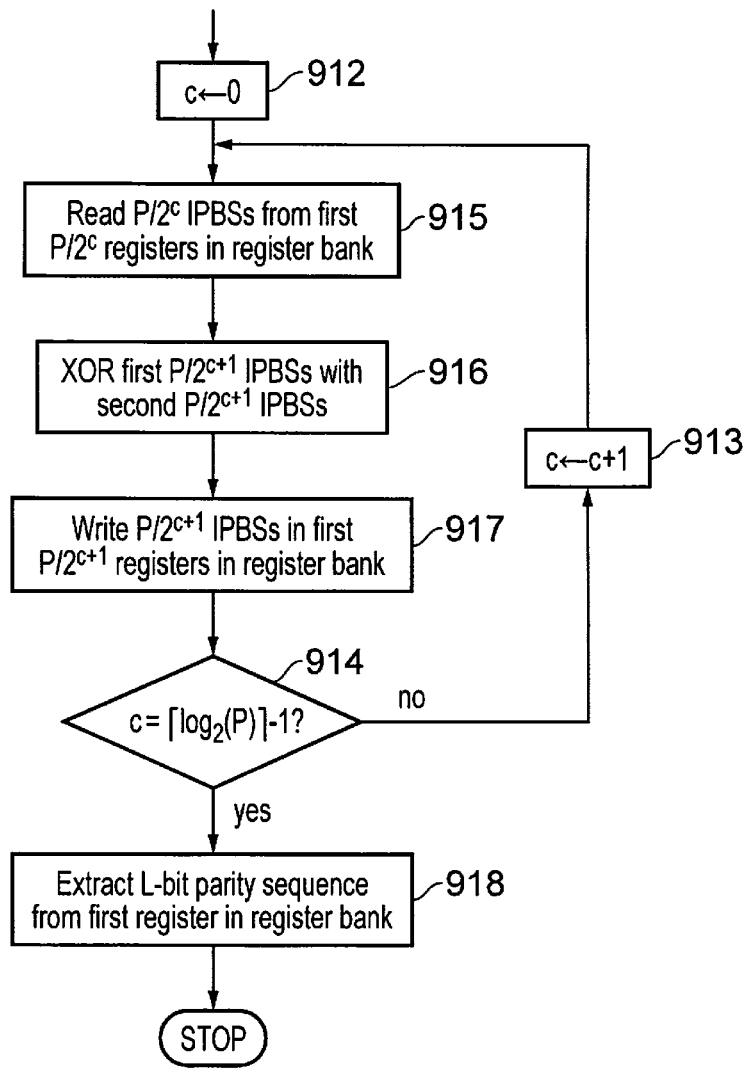

More specifically, the operation proceeds as illustrated in the flowchart of FIG. 9, which differs to FIG. 5 in only the computation 903 of the address used to read a set of P rows 402 of the generator matrix from the LUT.

Thus, FIG. 7 provides an example of how the sequence of B=15 CRC-encoded bits a=[1 1 0 1 1 0 0 1 1 0 0 0 1 0 1] 303 may be converted into a set of P=4 intermediate parity bit sequences 706, which are then combined into a sequence of L=6 syndrome bits $\tilde{p}$=[0 0 0 0 0 0], where K=B, s=b and $\tilde{p}$=p.

FIG. 9 illustrates a flow chart for an operation of a controller in an example embodiment of the present invention, operating on the basis of the inverse generator matrix G'.

Application

Figure 8:
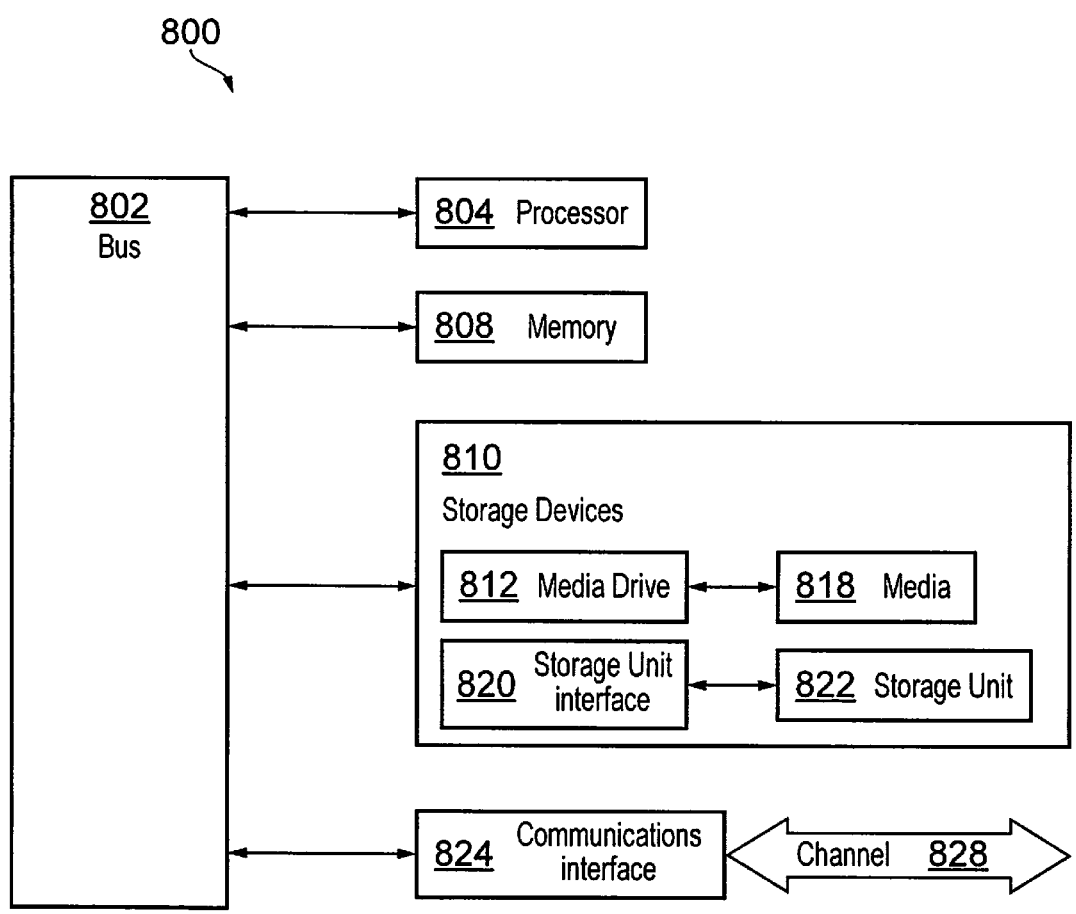
FIG. 8 illustrates a typical computing system that may be employed in an electronic device or a wireless communication unit to perform CRC computation in accordance with some example embodiments of the invention.

Referring now to FIG. 8, there is illustrated a typical computing system 800 that may be employed to implement CRC computation according to some example embodiments of the invention. Computing systems of this type may be used in wireless communication units. Those skilled in the relevant art will also recognize how to implement the invention using other computer systems or architectures. Computing system 800 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 800 can include at least one processors, such as a processor 804. Processor 804 can be implemented using a general or special-purpose processing engine such as, for example, a microprocessor, microcontroller or other control logic. In this example, processor 804 is connected to a bus 802 or other communications medium. In some examples, computing system 800 may be a non-transitory tangible computer program product comprising executable code stored therein for implementing CRC computation.

Computing system 800 can also include a main memory 808, such as random access memory (RAM) or other dynamic memory, for storing information and instructions to be executed by processor 804. Main memory 808 also may be used for storing temporary variables or other intermediate information during execution of instructions to be executed by processor 804. Computing system 800 may likewise include a read only memory (ROM) or other static storage device coupled to bus 802 for storing static information and instructions for processor 804.

The computing system 800 may also include information storage system 810, which may include, for example, a media drive 812 and a removable storage interface 820. The media drive 812 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 818 may include, for example, a hard disk, floppy disk, magnetic tape, optical disk, CD or DVD, or other fixed or removable medium that is read by and written to by media drive 812. As these examples illustrate, the storage media 818 may include a computer-readable storage medium having particular computer software or data stored therein.

In alternative embodiments, information storage system 810 may include other similar components for allowing computer programs or other instructions or data to be loaded into computing system 800. Such components may include, for example, a removable storage unit 822 and an interface 820, such as a program cartridge and cartridge interface, a removable memory (for example, a flash memory or other removable memory module) and memory slot, and other removable storage units 822 and interfaces 820 that allow software and data to be transferred from the removable storage unit 818 to computing system 800.

Computing system 800 can also include a communications interface 824. Communications interface 824 can be used to allow software and data to be transferred between computing system 800 and external devices. Examples of communications interface 824 can include a modem, a network interface (such as an Ethernet or other NIC card), a communications port (such as for example, a universal serial bus (USB) port), a PCMCIA slot and card, etc. Software and data transferred via communications interface 824 are in the form of signals which can be electronic, electromagnetic, and optical or other signals capable of being received by communications interface 824. These signals are provided to communications interface 824 via a channel 828. This channel 828 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 808, storage device 818, or storage unit 822. These and other forms of computer-readable media may store at least one instruction for use by processor 804, to cause the processor to perform specified operations. Such instructions, generally referred to as 'computer program code' (which may be grouped in the form of computer programs or other groupings), when executed, enable the computing system 800 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 800 using, for example, removable storage drive 822, drive 812 or communications interface 824. The control logic (in this example, software instructions or computer program code), when executed by the processor 804, causes the processor 804 to perform the functions of the invention as described herein.

Referring now to FIG. 9, in a second aspect of the invention and with reference to the previous discussion of FIG. 3 and FIG. 4 without necessarily a use of parallel processing, a flow chart 900 illustrates an operation of the controller in accordance with an example embodiment of the present invention of FIG. 7. During the first set of ⌈K/P⌉ steps, the P intermediate parity bit sequences 706 are accumulated in the register bank 304 of FIG. 3. This register bank 304 comprises P registers, each of which can store L' bits. A counter c 306 within the controller 305 is initialised 901 to a value of '0' at the start of the first step in the set of ⌈K/P⌉ steps 911 and this counter c 306 is incremented 902 at the start of a number of successive steps thereafter. In a number of the (say, each) steps, a set of P rows 702 of the generator matrix G are read 903 from the address (c) of the LUT 302. Meanwhile, the set of P bits 704 having the index c from the (extended) input bit sequence are provided 904 by the input stream 303.

In each of the first set of ⌈K/P⌉ steps, each of the P rows of the generator matrix G provided by the LUT 302 is masked 905 by the corresponding one of the P input bits provided by the input stream 303. More specifically, each of the P processors 301 performs the corresponding one of these P masking operations by ANDing 307 each of the L' bits in the corresponding row of the generator matrix G with the corresponding input bit. Owing to the alignment between the arrangement of the P input bits in the input stream 303 and the P rows of the generator matrix G in the LUT 302, this masking can be advantageously performed without the requirement for complex routing between the input stream 303, LUT 302 and processors 301.

Note that in the first of the ⌈K/P⌉ steps, in this example and when c=0, the set of P input bits 704 provided by the input stream 303 will include mod(−K,P) prepended zero-valued filler bits 705, in cases where K is not a multiple of P. As described above, these zero-valued filler bits are used to achieve the alignment and act to mask the corresponding mod(−K, P) rows from the set of P rows 702 of the generator matrix G that are read from the LUT 302. In this case, these mod(−K, P) masked rows will precede the last K rows of the generator matrix G, thereby advantageously ensuring that only the final K rows of the generator matrix G will have the opportunity to influence the P intermediate parity bit sequences 706. As described above, the final K of the $K_{max}$ rows in the generator matrix G stored in the LUT 302 are equal to the generator matrix G corresponding to K input bits. In this way, the same LUT 302 storing the generator matrix G corresponding to $K_{max}$ input bits can be advantageously reused for all values of K, even if K is not a multiple of P.

During the first step 906 among the first set of ⌈K/P⌉ steps when: c=0, the P masked rows of the generator matrix G obtained during that step are written 907 to the register bank 304, in order to initialize the P intermediate parity bit sequences 706. In a number of subsequent steps when: 0<c<⌈K/P⌉, the P intermediate parity bit sequences 706 are read 908 from the register bank 304 and provided to the P processors 301, where they are XORed 308 909 with the P masked rows of the generator matrix G obtained during that step. The results are then written 910 back to the register bank 304, in order to accumulate the P intermediate parity bit sequences 706. Note that the action of the counter c 306 is to read the ⌈K/P⌉ addresses in the LUT 302 in ascending order, in correspondence with the provision of sets of P input bits 704 by the input stream 303 in their natural ordering. However, in other arrangements, the input stream 303 could provide the sets of P input bits 704 in any order and the addresses of the LUT could be read in the corresponding order. FIG. 7 provides an example of how the sequence of B=15 CRC-encoded bits:

a=[1 1 0 1 1 0 0 1 1 0 0 0 1 0 1] 303 may be converted into a set of P=4 intermediate parity bit sequences 706.

During the second set of ⌈$\log_2(P)$⌉ steps 914, the register bank 304 is used to combine the P intermediate parity bit sequences 706 into the single desired parity bit sequence 102. The counter c 306 is initialised 912 to a value of 0 at the start of the first step in the set of ⌈$\log_2(P)$⌉ steps and this counter c 306 is incremented 913 at the start of successive steps thereafter. In a number of the steps when 0≤c<⌈$\log_2(P)$⌉, a set of $P/2^c$ intermediate parity bit sequences are read 915 from the first $P/2^c$ registers in the bank 304 of P register. This set of $P/2^c$ intermediate parity bit sequences is then decomposed into two sub-sets, each comprising $P/2^{c+1}$ intermediate parity bit sequences. Each of the intermediate parity bit sequences in the first sub-set of $P/2^{c+1}$ intermediate parity bit sequences is then XORed 308 916 with the corresponding intermediate parity bit sequence from the second sub-set of $P/2^{c+1}$ intermediate parity bit sequences. The resultant set of $P/2^{c+1}$ XORed 308 intermediate parity bit sequences is then written 917 to the first set of $P/2^{c+1}$ registers in the bank 304 of P registers.

Following the completion of the last step in the second set of ⌈$\log_2(P)$⌉ steps, the P intermediate parity bit sequences will have been combined into the single desired parity bit sequence, which is stored in the first register in the bank 304 of P registers. The L bits of this parity bit sequence p=[$p_0$, $p_1$, $p_2$, . . . , $p_{L-1}$] may then be extracted 918 from the L' bits of the register, by removing the zero-valued padding bits. Note that in the approach described here, the P intermediate parity bit sequences are successively combined into the first of the P registers in the register bank 304.

In alternative arrangements, the P intermediate parity bit sequences may be successively combined into any of the P registers in the register bank 304. For example, and referring back to FIG. 7 an example of how a set of P=4 intermediate parity bit sequences 706 may be combined into a sequence of L=6 syndrome bits $\tilde{p}$=[0 0 0 0 0 0], where K=B, s=b and $\tilde{p}$=p.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of a CRC computation. However, it will be appreciated that the present invention is not limited to such integrated circuit devices, and may equally be applied to integrated circuit devices comprising any alternative type of operational functionality. Examples of such integrated circuit device comprising alternative types of operational functionality may include, byway of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired CRC computation by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as at least one than one. Also, the use of introductory phrases such as 'at least one' and 'at least one' in the claims should not be construed to imply that the introduction of another claim element by the indefinite articles 'a' or 'an' limits any particular claim containing such introduced claim element to inventions containing only one such element, even when the same claim includes the introductory phrases 'at least one' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

REFERENCES

[1] "3rd Generation Partnership Project; Technical Specification Group Radio Access Network; NR; Multiplexing and channel coding (Release 15)", 3GPP TS 38.212 V15.2.0, June 2018.
[2] Nokia, Alcatel-Lucent Shanghai Bell, "R1-1703497 Details of CRC distribution of polar design", 3GPP TSG-RAN WG1 Meeting #88, Athens, Greece, February 2017.
[3] Intel, "Fast CRC Computation for Generic Polynomials Using PCLMULQDQ Instruction", December 2009.

The invention claimed is:

1. A cyclic redundancy check, CRC, decoder circuit comprising:
an input for receiving an input stream that has a K-bit input bit sequence, s, comprising information bits and CRC bits from a predefined CRC generator polynomial that encoded the K-bit input bit sequence; and
a number, P, of at least one processor configured to perform a CRC decode computation of the K-bit input bit sequence, s;
a Look Up Table, LUT, operably coupled to the at least one processor and comprising a plurality of addresses, the at least one processor configured to:
use an inverse of the predefined CRC generator polynomial that encoded the K-bit input bit sequence, s, to produce a data set;
compute a CRC syndrome from the data set; and
determine whether the CRC syndrome contains any one-valued bits indicative of a CRC error;
wherein at least one of the plurality of addresses is configured to store one or more rows of a CRC generator matrix (G) generated from the inverse of the predefined CRC generator polynomial; and
wherein a set of mod(-K,P) zero-valued filler bits are appended to an end of the K-bit input bit sequence, s, and wherein an order of the rows in the CRC generator matrix (G) is reversed and aligned with the input bits of the input stream.

2. The CRC decoder circuit of claim 1, wherein the at least one processor is configured to first combine LUT data with the input stream by using one or more bits of the aligned input stream to mask the one or more rows of the CRC generator matrix stored in the LUT.

3. The CRC decoder circuit of claim 2, wherein the LUT is operably coupled to at least two processors and comprises a plurality of addresses wherein the number, P, of processors is two or more and where the number of rows stored in each address of the LUT is two or more; and
wherein the at least two processors are configured to:
first combine LUT data with the input stream to generate two or more intermediate parity bit sequences; and
second combine the two or more intermediate parity bit sequences into a single parity bit sequence.

4. The CRC decoder circuit of claim 3, wherein the two or more rows of the CRC generator matrix stored in each address of the LUT is aligned by the set of mod(-K,P) zero-valued filler bits appended to the K-bit input bit sequence, s.

5. The CRC decoder circuit of claim 4, wherein alignment with the two or more rows of the CRC generator matrix stored in the LUT comprises one of:
the at least two processors receiving the input stream with zero padding that provides an input bit sequence length K+mod(-K,P);
wherein the K-bit input bit sequence is of a first length K and at least one of the two or more processors appends the mod(-K,P) zero-valued filler bits to the end of the K-bit input bit sequence.

6. The CRC decoder circuit of claim 3, wherein the generation of two or more intermediate parity bit sequences comprises multiple, $\lceil K/P \rceil$, first combinations of data, where K is a length of the K-bit input bit sequence.

7. The CRC decoder circuit of claim 3, wherein the second combination of the two or more intermediate parity bit sequences is performed multiple, $\lceil \log_2(P) \rceil$, times to generate a single parity bit sequence, where P is a number of the two or more processors.

8. The CRC decoder circuit of claim 1, wherein a number of rows in the CRC generator matrix stored in the LUT is equal to or exceeds a maximum supported input bit sequence length ($K_{max}$) divided by the number P of the one or more processors.

9. The CRC decoder circuit of claim 1, further comprising a controller operably coupled to, and configured to control, the at least one processor and the LUT.

10. The CRC decoder circuit of claim 1, wherein a number of bits in at least one of the rows of the generator matrix (G) is a first length (L) and is padded with zero-valued bits to increase the number of bits in the at least one of the rows to a second length (L').

11. A communication unit comprising a cyclic redundancy check, CRC, decoder circuit comprising:
an input for receiving an input stream that has a K-bit input bit sequence, s, comprising information bits and CRC bits from a predefined CRC generator polynomial that encoded the K-bit input bit sequence; and
a number, P, of at least one processor configured to perform a CRC decode computation of the K-bit input bit sequence, s;
a Look Up Table, LUT, operably coupled to the at least one processor and comprising a plurality of addresses, the at least one processor configured to:
use an inverse of the predefined CRC generator polynomial that encoded the K-bit input bit sequence, s, to produce a data set;
compute a CRC syndrome from the data set; and determine whether the CRC syndrome contains any one-valued bits indicative of a CRC error;

wherein at least one of the plurality of addresses is configured to store one or more rows of a CRC generator matrix (G) generated from the inverse of the predefined CRC generator polynomial; and wherein a set of mod(−K,P) zero-valued filler bits are appended to an end of the K-bit input bit sequence, s, and wherein an order of the rows in the CRC generator matrix (G) is reversed and aligned with the input bits of the input stream.

12. The communication unit of claim 11, wherein the at least one processor is configured to first combine LUT data with the input stream by using one or more bits of the aligned input stream to mask the one or more rows of the CRC generator matrix stored in the LUT.

13. The communication unit of claim 12, wherein the LUT is operably coupled to at least two processors and comprises a plurality of addresses wherein the number, P, of processors is two or more and where the number of rows stored in each address of the LUT is two or more; and
wherein the at least two processors are configured to:
first combine LUT data with the input stream to generate two or more intermediate parity bit sequences; and
second combine the two or more intermediate parity bit sequences into a single parity bit sequence.

14. The communication unit of claim 11 wherein a number of rows in the CRC generator matrix stored in the LUT is equal to or exceeds a maximum supported input bit sequence length ($K_{max}$) divided by the number P of the one or more processors.

15. The communication unit of claim 11, further comprising a controller operably coupled to, and configured to control, the at least one processor and the LUT.

16. The communication unit of claim 11, wherein a number of bits in at least one of the rows of the generator matrix (G) is a first length (L) and is padded with zero-valued bits to increase the number of bits in the at least one of the rows to a second length (L').

17. A method for cyclic redundancy check, CRC, comprising:

receiving an input stream that has a K-bit input bit sequence, s, comprising information bits and CRC bits from a predefined CRC generator polynomial that encoded the K-bit input bit sequence, s; and performing a CRC decode computation of the K-bit input bit sequence, s, by a number, P, of at least one processor;

using an inverse of the predefined CRC generator polynomial that encoded the K-bit input bit sequence, s, to produce a data set;

computing a CRC syndrome from the data set; and determining whether the CRC syndrome contains any one-valued bits indicative of a CRC error, wherein at least one of a plurality of addresses of a look-up table, LUT, is configured to store one or more rows (702) of a CRC generator matrix (G) generated from the inverse of the predefined CRC generator polynomial; and wherein a set of mod(−K,P) zero-valued filler bits are appended to an end of the K-bit input bit sequence, s, and wherein an order of the rows in the CRC generator matrix (G) is reversed and aligned with the input bits of the input stream.

18. The method for CRC of claim 17, further comprising first combining LUT data with the input stream by using one or more bits of the aligned input stream to mask the one or more rows of the CRC generator matrix stored in the LUT.

19. The method for CRC of claim 17, wherein a number of rows in the CRC generator matrix stored in the LUT is equal to or exceeds a maximum supported input bit sequence length ($K_{max}$) divided by the number P of the one or more processors.

20. The method for CRC of claim 17, wherein a number of bits in at least one of the rows of the generator matrix (G) is a first length (L), the method further comprising padding the number of bits in the at least one of the rows of the generator matrix (G) of a first length (L) with zero-valued bits to increase the number of bits in the at least one of the rows to a second length (L').

* * * * *